United States Patent [19]

Matsukawa et al.

[11] Patent Number: 5,172,196
[45] Date of Patent: Dec. 15, 1992

[54] NONVOLATILE SEMICONDUCTOR MEMORY DEVICE

[75] Inventors: Naohiro Matsukawa, Kamakura; Yoshihisa Mizutani, Tokyo, both of Japan

[73] Assignee: Kabushiki Kaisha Toshiba, Kawasaki, Japan

[21] Appl. No.: 440,427

[22] Filed: Nov. 21, 1989

Related U.S. Application Data

[63] Continuation of Ser. No. 309,012, Feb. 9, 1989, abandoned, which is a continuation of Ser. No. 52,225, May 21, 1987, abandoned, which is a continuation of Ser. No. 802,162, Nov. 25, 1985, abandoned.

[30] Foreign Application Priority Data

| Nov. 26, 1984 | [JP] | Japan | 59-249161 |
| May 1, 1985 | [JP] | Japan | 60-94307 |
| Sep. 30, 1985 | [JP] | Japan | 60-216485 |

[51] Int. Cl.$^5$ .............. H01L 29/68; H01L 27/02; H01L 29/34
[52] U.S. Cl. .................................. 257/316; 257/532
[58] Field of Search ............ 357/23.5, 23.6, 51, 357/54

[56] References Cited

U.S. PATENT DOCUMENTS

| 4,274,012 | 6/1981 | Simko | 357/23.5 |
| 4,282,446 | 8/1981 | McElroy | 357/23.5 |
| 4,314,265 | 2/1982 | Simko | 357/54 |
| 4,328,565 | 5/1982 | Harari. | |
| 4,437,174 | 3/1984 | Masuoka. | |
| 4,527,258 | 7/1985 | Guterman | 365/185 |
| 4,558,339 | 12/1985 | Angle | 357/23.5 |
| 4,577,215 | 3/1986 | Stewart et al. | 357/23.6 |
| 4,608,591 | 8/1986 | Ipri et al. | 357/23.5 |
| 4,616,245 | 10/1986 | Vopech et al. | 357/23.5 |
| 4,652,897 | 3/1987 | Okuyama et al. | 357/23.5 |
| 4,654,825 | 3/1987 | Rinerson | 357/23.5 |
| 4,663,645 | 5/1987 | Kamori et al. | 357/23.5 |
| 4,686,558 | 8/1987 | Adam | 357/23.5 |

FOREIGN PATENT DOCUMENTS

| 52-23782 | 2/1977 | Japan | 357/23.5 |
| 57-134975 | 11/1982 | Japan | 357/23.5 |
| 59-74678 | 4/1984 | Japan | 357/23.5 |
| 60-55668 | 3/1985 | Japan | 357/23.5 |

Primary Examiner—J. Carroll
Attorney, Agent, or Firm—Finnegan, Henderson, Farabow, Garrett and Dunner

[57] ABSTRACT

A nonvolatile semiconductor memory device has $n^+$-type source and drain regions formed in the surface of a p-type semiconductor substrate, a floating gate formed above and insulated from a channel region provided between the source and drain regions, and a control gate formed above and insulated from the floating gate. The memory device further has a capacitor provided between the control gate and drain region.

16 Claims, 4 Drawing Sheets

NONVOLATILE SEMICONDUCTOR MEMORY DEVICE

This application is a continuation of application Ser. No. 07/309,012, filed Feb. 9, 1989, which is a continuation of application Ser. No. 07/052,225, filed May, 21, 1987, abandoned which is a continuation application of Ser. No. 06/802,162, filed Nov. 25, 1985, abandoned.

BACKGROUND OF THE INVENTION

This invention relates to a semiconductor memory device and, more particularly, to a nonvolatile semiconductor memory device such as an EEPROM and an EPROM.

The nonvolatile semiconductor device is usually made in the form of an LSI device comprising a semiconductor chip and a number of memory cells formed on the chip. The degree of integration of this device has recently substantially increased. The device can preserve digital data for a predetermined period of time without consuming power. The data can be read from the device much faster than from a magnetic disk. Nonvolatile semiconductor devices such as an EEPROM and an EPROM can rewrite the stored data, and their utility is very high. The EEPROM and EPROM are different from each other in the method of erasing the data.

In the EEPROM, an electric control signal is used to erase the stored information. In the EPROM, ultraviolet rays are used for the same purpose. The EEPROM comprises memory cells each having a floating gate MOS transistor. The well-known floating gate MOS transistor for a EEPROM includes source and drain regions formed in the surface area of a semiconductor substrate. It also includes a channel region provided between the source and drain regions, a floating gate formed over the channel and drain region and insulated therefrom, and a control gate formed over the floating gate and insulated from this gate. The floating gate and control gate are wholly covered by an insulating layer. The floating gate and drain region are set apart for a distance shorter than the distance between the floating gate and channel region.

This floating gate MOS transistor stores a datum or bit determined by the amount of charge in the floating gate. The floating gate is charged or discharged under the control of the potential difference between the control gate and drain region. More specifically, according to the potential difference, a tunnel current flows through that portion of the insulating layer which is located between the floating gate and drain region, thereby charging or discharging the floating gate.

Heretofore, the bit stored in the floating gate MOS transistor is rewritten in the following way. First, an erasing voltage (e.g., of +15 V) is applied to the control gate. The floating gate is charged, thus erasing the bit. Then, a programming voltage (e.g., of +15 V) is applied to the drain region. The floating gate is discharged, thus writing new bit in the floating gate MOS transistor. It usually takes 100 μsec. to 10 msec. to rewrite a bit of data.

Usually, in the EEPROM, the bits of data stored in memory cells forming one word memory (e.g. of 8 bits) are erased simultaneously, and subsequently new bit of "1" or "0" are written in each memory cell.

The prior art method of rewriting data, used with a high integration degree EEPROM, is disadvantageous in that the data-rewriting time increases in proportion to the storage capacity of the EEPROM. In the case of 256-KB EEPROM, tens of seconds to several minutes is required for renewing all the data.

In the EPROM, the stored data is erased by ultraviolet rays. The EPROM it is slightly different from the EEPROM in the structure of the floating gate MOS transistor. More specifically, the floating gate is formed over the channel region and insulated from this region. The gate is charged by the hot carriers generated in the channel region. With EPROM, it takes 100 μsec. to 1 msec. to write one bit of data. The data-writing time increases in proportion to the storage capacity like the EEPROM.

Accordingly, it has been demanded that the data-writing time in the EEPROM and EPROM be reduced.

SUMMARY OF THE INVENTION

An object of the invention is to provide a non-volatile semiconductor memory device in which the time necessary for controlling the writing operation is reduced.

According to the invention, a nonvolatile semiconductor memory device is provided which comprises a floating gate MOS transistor in which a control voltage is applied between the control gate and one end of the current path, and which stores data corresponding to the control voltage, and a capacitor connected between the control gate and the one end of the current path to be charged by the control voltage and to continuously apply the control voltage to the floating gate MOS transistor after being charged.

DETAILED DESCRIPTION OF THE PREFERRED EMBODIMENTS

Figure 1:
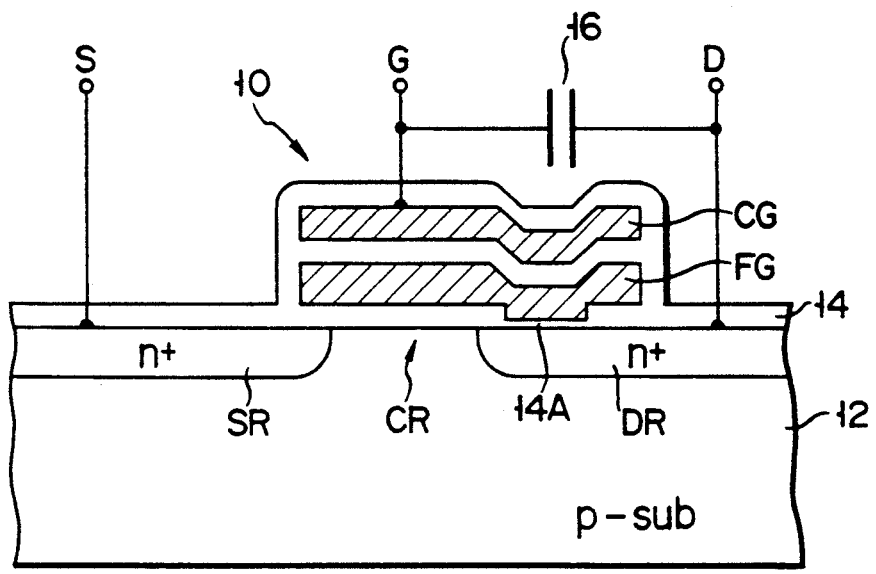
FIG. 1 is a pictorial sectional representation of a first embodiment of the nonvolatile semiconductor memory device according to the invention.
Figure 2:
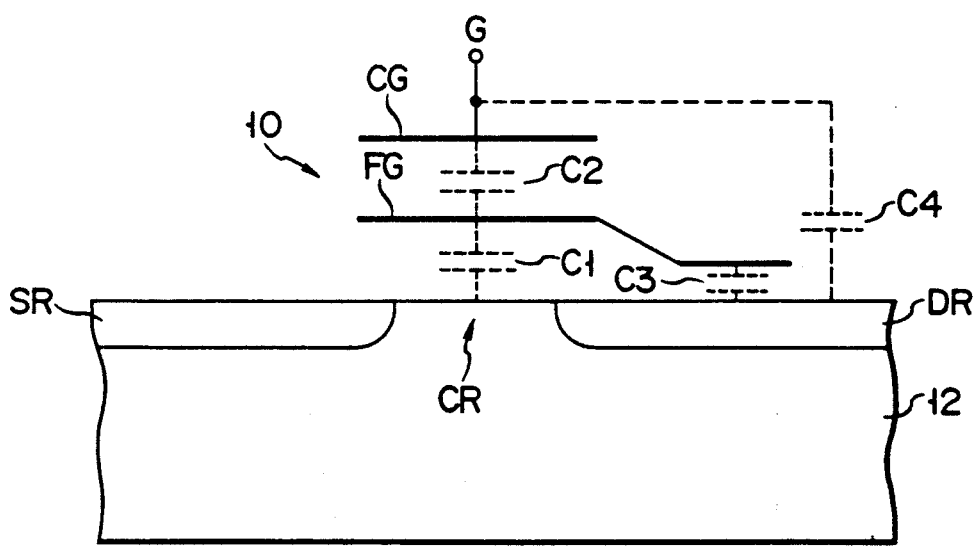
FIG. 2 is a view for explaining the operation of the memory device shown in FIG. 1.

FIGS. 1 and 2 illustrate one embodiment of the semiconductor memory device according to the invention. The memory device includes source and drain regions SR and DR of $n^+$-type conductivity formed in the area of a semiconductor substrate 12 of p-type conductivity. A portion of the substrate 12 between the source and drain regions SR and DR is used as a channel region CR. The memory device also has a floating gate FG formed over and insulated from the channel region CR and drain region DR. The memory device further has a control gate CG formed over and insulated from the floating gate FG. An oxide layer 14, shown in FIG. 1, wholly covers the floating gate FG and control gate CG, and it also covers the exposed portions of the semiconductor structure. A portion of the oxide layer 14 extending between the floating gate FG and drain region DR has a reduced thickness portion, i.e., a thin oxide layer 14A. The thin oxide layer portion 14A has a thickness of 0.01 μm and an area of 1 μm². The capacitance C2 between the control gate CG and floating gate FG is set to 0.1 pF. The sum of the capacitance C1 between the floating gate FG and substrate 12 and the capacitance C3 between the floating gate FG and drain region DR is set to 0.05 pF. The source region SR is connected to a source terminal S, which is held at ground potential. The drain region DR is connected to a drain terminal D, to which a programming voltage (e.g., of 15 V) is applied. The control gate CG is connected to a control terminal G, to which an erasing voltage (e.g., of 15 V) is applied. The control and floating gates CG and FG and source, drain and channel regions SR, DR and CR constitute a floating gate MOS transistor 10.

The memory device further has a capacitor 16 connected between the control gate CG and drain region DR. The capacitance of the capacitor 16 is set to 0.2 pF, for instance.

In operation, when the erasing voltage is applied to the floating gate MOS transistor 10, the control gate CG is set to a higher potential than the potential of the drain region DR. As a result, a tunnel current is caused to flow from the floating gate FG through the thin oxide layer portion 14A to the drain region DR. The floating gate FG is thus charged. When the programming voltage is applied, the drain region DR is set to a higher potential than the potential of the control gate CG. As a result, a tunnel current is caused to flow from the drain region DR through the thin oxide layer portion 14A to the floating gate FG. The floating gate FG is thus discharged. The capacitor 16 is charged by the erasing and programming voltages. After the termination of the erasing voltage or programming voltage, a current is supplied to the floating gate MOS transistor until the floating gate FG is completely discharged or charged. With the charging or discharging of the floating gate FG, the threshold value of the floating gate MOS transistor 10 is shifted by 2 V.

It is assumed that first and second transistors with a mutual conductance gm of 0.1 m, for instance, are used for applying erasing and programming voltages to the control and drain terminals G and D, respectively.

When a voltage of 15 V, for instance, is applied as the erasing voltage to the control terminal G, the capacitor 16 stores charge of 3 pC (=C4×15). The charging of the capacitor 16 takes about 5 nsec. at the most. (The time constant τ determined by the capacitor 16 and first or second transistor is C4/gm=2 nsec.) After the capacitor 16 has been charged, the erasing voltage is removed. Then, the capacitor 16 supplies current to the floating gate MOS transistor until the floating gate FG is completely charged. The floating gate FG stores charge of 0.2 pC (=2V×C2) until the threshold value of the floating gate MOS transistor is shifted by 2 V. For this reason, the terminal voltage across the capacitor 16 is eventually reduced to 14 V (i.e., 2.8 pC/pF) but does not drop below this level.

When a programming voltage is applied to the drain terminal D, the charging of the capacitor 16 is completed in 5 nsec., similar to the case of erasing except that the polarity of the charging voltage is reversed. The programming voltage is thus removed at the instant when the charging of the capacitor 16 is completed. Subsequently, the capacitor 16 supplies to the floating gate transistor 10 a current flowing in the direction opposite to that for the case of erasing to completely discharge the floating gate FG.

The charging and discharging of the floating gate FG while ignoring the capacitor 16 will now be considered. The voltage VFD between the floating gate FG and drain region DR is given as $$VFD = 15 \times \frac{C2}{C1 + C2 + C3} = 10 \text{ V}$$

Considering the thickness and area of the thin oxide layer portion 14A (respectively 0.01 μm and 1 μm²), a tunnel current of $10^{-10}$ A flows through the thin oxide layer portion 14A. This means that a time period of 2 msec. is necessary for the floating gate FG to store charge of 0.2 pC at the time of the erasing.

In this embodiment of the semiconductor memory device, the erasing voltage or programming voltage is supplied only for a very short period of 5 nsec. During this time, the charging of the capacitor 16 is completed, so that the floating gage FG can receive the charging or discharging current from the capacitor 16. Thus, with this memory device the time necessary for the control of the writing of data (i.e., the erasing and programming operations) can be greatly reduced.

On the other hand, with the prior art memory device, which does not have the capacitor 16, the supply of the erasing or programming voltage cannot be discontinued until the floating gate is completely charged or discharged. That is, under the same conditions as in the above embodiment, these voltages should be supplied for a period of 2 msec.

Therefore, where a number of memory devices having the structure of the above embodiment are formed as memory cells on a semiconductor chip, it is possible to control the writing of data in a memory cell while another memory cell is in a writing operation. The time necessary for writing data in all the memory cells thus can be substantially reduced. The structure of the embodiment permits reliable reduction of a data writing period of, for instance, several ten seconds required with the prior art structure to several msec.

Figure 3:
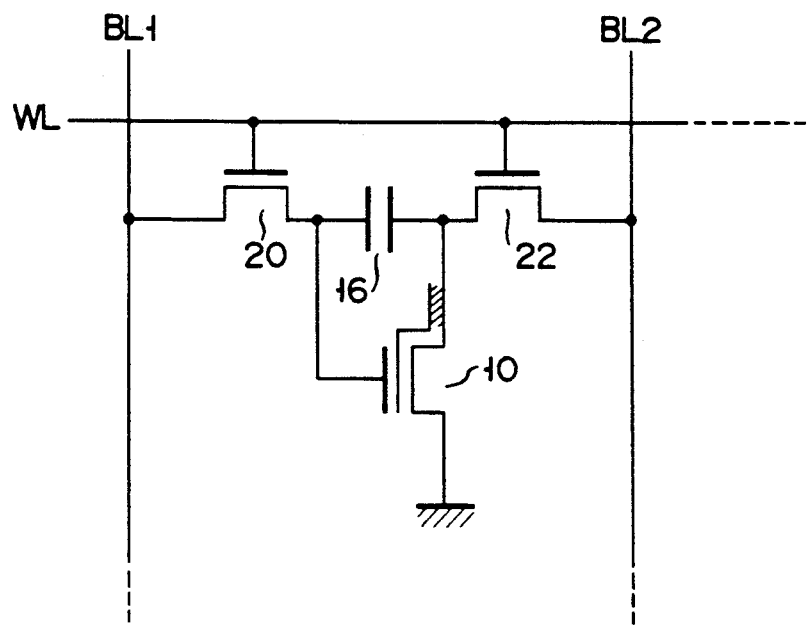
FIG. 3 is a circuit diagram showing a second embodiment of the nonvolatile semiconductor memory device according to the invention.

A second embodiment of the semiconductor memory device will now be described with reference to FIGS. 3, 4, 5A and 5B. This memory device is an EEPROM having a number of memory cells on a semiconductor chip (not shown). FIG. 3 shows the circuit of one of the memory cells in the EEPROM. The memory cell has floating gate MOS transistor 10 and capacitor 16, both having of the same structure as the device of the preceeding embodiment shown in FIG. 1. As in the preceeding embodiment, the capacitor 16 is connected between the control and drain gates CG and DR of the floating gate MOS transistor 10. The control gate CG is connected to a bit line BL1 through the current path of an n-channel MOS transistor 20. The drain region DR is connected to a bit line BL2 through the current path of a n-channel MOS transistor 22. The MOS transistors 20 and 22 have their control gates connected to a word line WL. This EEPROM has a plurality of word lines (not shown) and a plurality of pairs of bit lines (not shown) in addition to the word line WL and pair of bit lines BL1 and BL2 shown in FIG. 3. In this EEPROM the memory cells are formed as a matrix array on the semiconductor chip. The bit line pairs extend along columns of memory cells, while word lines extend along rows of memory cells. The memory cells in each row are connected to a common word line, e.g., the word line WL. The MOS transistors 20 and 22 are turned on when they receive a select signal via the word line WL. The memory cells in each column are connected to a common pair of bit lines, e.g., the bit lines BL1 and BL2. During data writing, the bit line BL1 transfers the erasing voltage, while the bit line BL2 transfers the programming voltage. For example, when the bit to be written is of logic value "0", the bit lines BL1 and BL2 are set to the respective potentials of 15 V and 0 V. When the bit to be written is of logic value "1", the bit lines BL1 and BL2 are set to the respective potentials of 0 V and 15 V. During data reading, the bit lines BL1 and BL2 are set to respective predetermined potentials of 5 V and 2.5 V. When the transistors 20 and 22 are turned on, the floating gate MOS transistor 10 varies the potential on the bit line B2 according to the amount of charge on the floating gate FG. That is, when the floating gate FG is in the discharged state, the floating gate MOS transistor 10 is rendered conductive. The potential on the bit line BL2 is thus forcibly brought to the ground level. When the floating gate FG is in the charged state, the floating gate MOS transistor is rendered non-conductive. The potential on the bit line BL2 thus is held at a predetermined level. A change in the potential on the bit line BL2 is read out as read data by the sense amplifier.

In this embodiment, as in the previous embodiment, the erasing or programming voltage continues to be applied to the corresponding one of bit lines BL1 and BL2 for a predetermined period of time necessary for the complete charging or discharging of the capacitor 16. During this time, the transistors 20 and 22 are rendered conductive by the select signal from the word line WL. After the lapse of the predetermined period of time, the floating gate FG is supplied with a current for charging or discharging. Also, after the predetermined period of time, the select signal is supplied to a different word line for memory cells in which the next bit is to be written. The bit lines BL1 and BL2 are supplied with a voltage (i.e., erasing or programming voltage) corresponding to the next write bit.

In the circuit of this embodiment, a "0" is written in the floating gate MOS transistor 10 when the bit lines BL1 and BL2 are set to respective potentials of 15 V and 0 V. On the other hand, bit "1" is written in the floating gate MOS transistor 10 when the bit lines BL1 and BL2 are set to respective potentials of 0 V and 15 V. It is to be noted that the potentials on the bit lines BL1 and BL2 are simultaneously set in a complementary relation to each other. Thus, a new bit is written in the floating gate MOS transistor 10 simultaneously with the erasing of the old bit. That is, with the circuit of this embodiment, there is no need for erasing the old bit in the floating gate MOS transistor 10 before writing a new bit there. The time necessary for writing data in each memory cell thus can be reduced.

Figure 4:
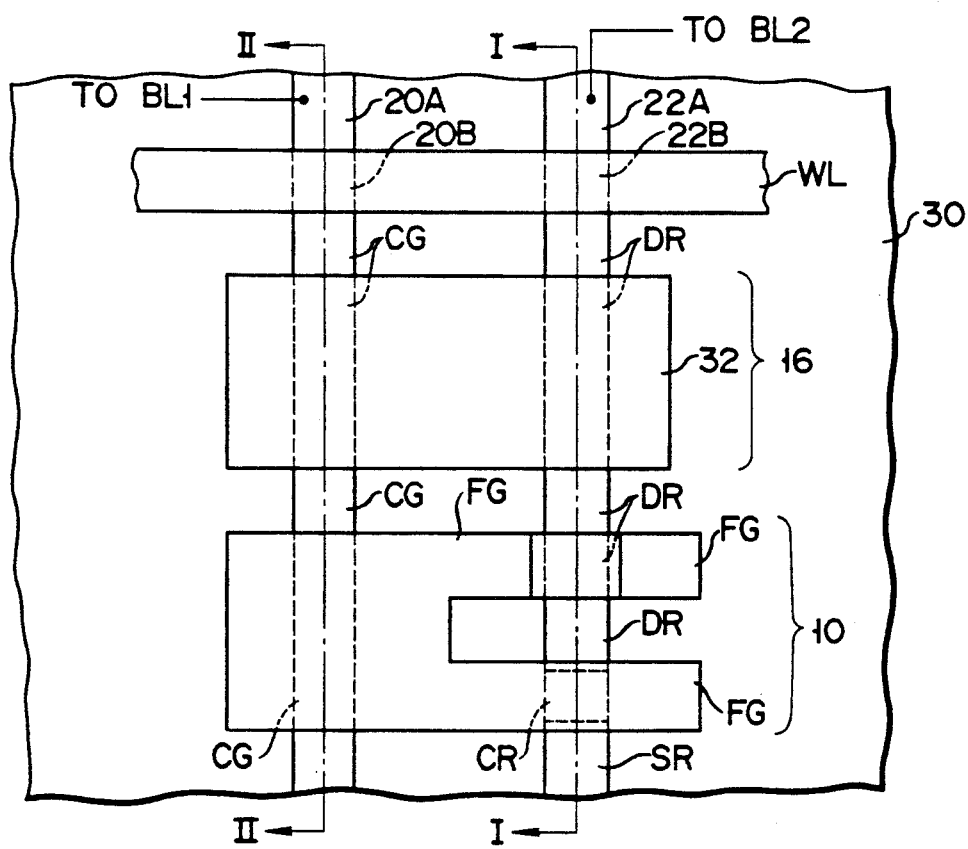
FIGS. 4, 5A and 5B are views showing the structure of the memory device shown in FIG. 3 in detail.
Figure 5A:
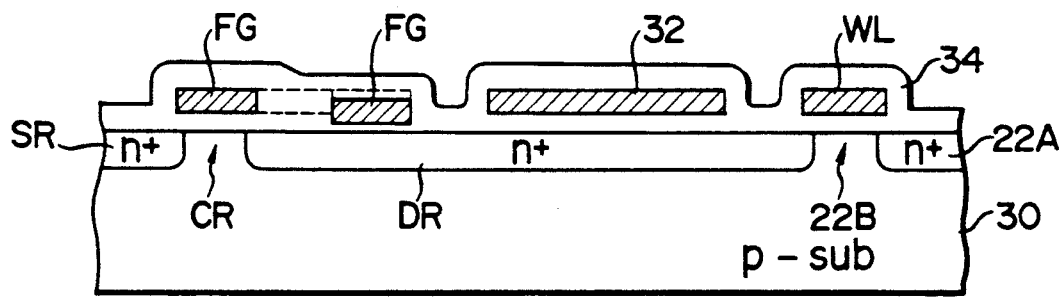
Figure 5B:
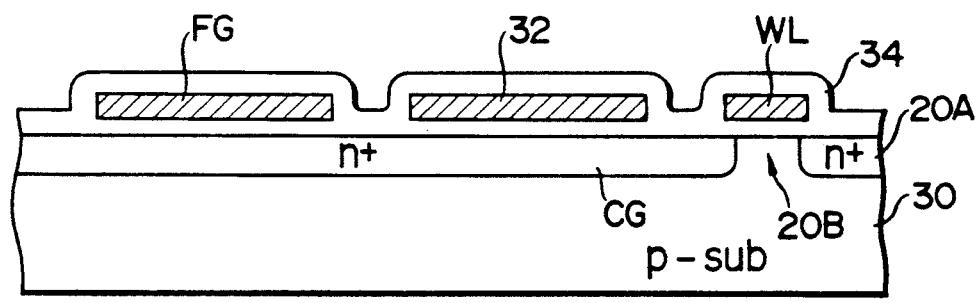

The structure of the memory cell shown in FIG. 3 will now be described in greater detail. FIG. 4 is a top view of the memory cell formed on the semiconductor chip. FIG. 5A shows the memory cell structure in a section taken along line I—I in FIG. 4. FIG. 5B shows the memory cell structure in a section taken along line II—II in FIG. 4. The control gate CG of the floating gate MOS transistor 10 is formed as an n+-type region in the surface area of a p-type silicon substrate 30. It extends in the direction of the columns. The drain and source regions DR and SR are formed as n+-type regions in the surface area of the substrate 30. The drain region DR extends in the direction of the columns, i.e., parallel to the control gate CG. The source region SR is aligned with the drain region DR in the direction of the columns and spaced apart a predetermined distance form one end of the drain region DR. A portion of the substrate 30 between the drain and source regions DR and SR is used as the channel region CR. The MOS transistors 20 and 22 have respective n+-type regions 20A and 22A in surface portions of the substrate 30. The n+-type region 22A is aligned with the drain region DR in the direction of the columns and spaced apart a predetermined distance from the other end of the drain region DR. A portion of the substrate 30 between the drain region DR and n+-type region 22A is used as the channel region 22B of the MOS transistor 22. The n+-type region 20A is aligned with the control gate CG in the direction of the columns and spaced apart from the end of the control gate CG nearer the channel region 22B. A portion of the substrate 30 between the control gate CG and n+-type region 20A is used as the channel region 20B of the MOS transistor 20. The n+-type regions 20A and 22A are connected to the respective bit lines BL1 and BL2. The word line WL is of polycrystalline silicon and is formed over and insulated from the substrate 30. The word line WL extends in the direction of the rows across the channel regions 20B and 22B. The floating gate FG is of polycrystalline silicon and is formed over and insulated from the substrate 10, control gate CG, and drain region DR. The floating gate FG partly extends across the channel region CR. A conductive layer 32, shown in FIG. 4, is of polycrystalline silicon and is insulatively formed over the control gate CG and drain region DR. The capacitance of the capacitor 16, shown in FIG. 3, is the result of the capacitance between the conductive layer 32 and control gate CG and the capacitance between the conductive layer 32 and drain region DR. An oxide layer 34, shown in FIGS. 5A and 5B, wholly covers the word line WL, conductive layer 32, and floating gate FG, and also covers the exposed portions of the substrate 30. As with the embodiment of FIG. 1, a portion of the oxide layer 34 between the floating gate FG and drain-region DR has a reduced thickness portion.

In this embodiment, the control gate CG and drain region DR are used as part of the current paths of the MOS transistors 20 and 22.

With the above structure of the memory cell, the conductive layer 32 can be formed in the same process as the floating gate FG and word line WL. More specifically, the oxide layer 34 is formed in a two-step thermal oxidation process. In the first step of the thermal oxidation, portions of the oxide layer 34 are formed to a predetermined but varying thickness on the surface of the substrate 30, control date CG, source and drain regions SR and DR, and n+-type regions 20A and 22A. Subsequently, a polycrystalline silicon layer is formed to cover the whole semiconductor structure. The polycrystalline silicon layer thus formed is patterned according to the shape of the floating gate FG, conductive layer 32, and word line WL. In the second step of the thermal oxidation process, the floating gate FG, conductive layer 32, and word line WL are thermally oxidized together with the exposed portion of the oxide layer 34 formed in the first thermal oxidation step, whereby the perfect oxide layer 34 is obtained. Conventionally, the floating gate FG and word line WL are formed in the process as described above. Therefore, with this memory cell structure, there is no need to increase the number of manufacturing steps compared to the prior art process to connect the capacitor 16 to the floating gate MOS transistor 10.

Figure 6:
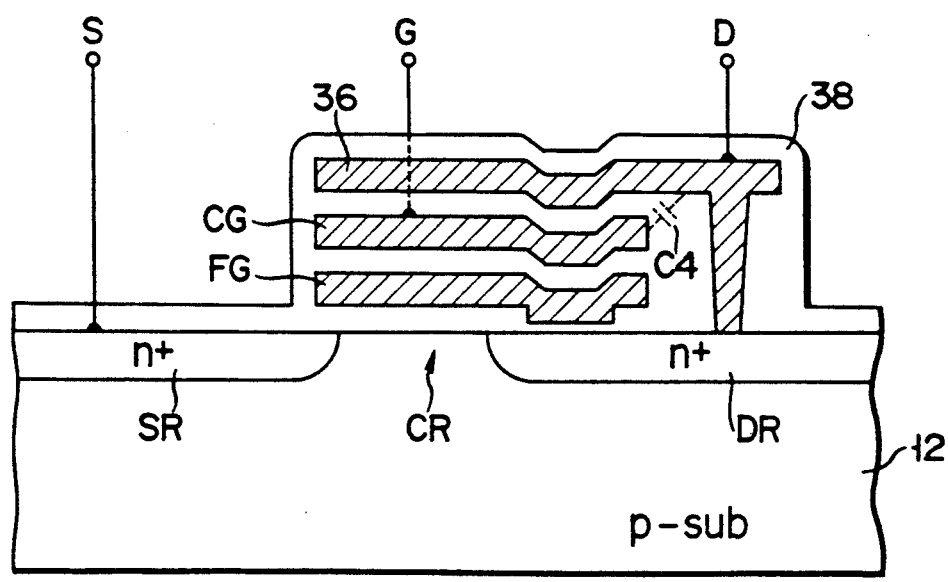
FIG. 6 is a pictorial sectional representation of a third embodiment of the nonvolatile semiconductor memory device according to the invention which is an equivalent circuit to the memory device shown in FIG. 1.

FIG. 6 shows a further embodiment of the memory device, which represents an equivalent circuit to the memory device shown in FIG. 1. In this device, the capacitor 16 shown in FIG. 1 is integrally formed with the floating gate MOS transistor 10. More specifically, the memory device shown in FIG. 6 has a conductive layer 36 formed over and insulated from the control gate CG. The conductive layer 36 is in ohmic contact with the drain region DR. The control terminal G is connected to the control gate CG at a position where the conductive layer 36 is not found above. The floating gate FG, control gate CG and conductive layer 38 are wholly covered by an oxide layer 38. In this memory device, the control gate CG and conductive layer 36 constitute the capacitor 16 shown in FIG. 1.

This memory device is an equivalent circuit to, and hence operates in the same way as, the memory device shown in FIG. 1. Thus, with this memory device the same effects as the memory device shown in FIG. 1 can be obtained.

The memory device shown in FIG. 6 can be used as the floating gate MOS transistor 10 and capacitor 16 shown in FIG. 3.

Figure 7:
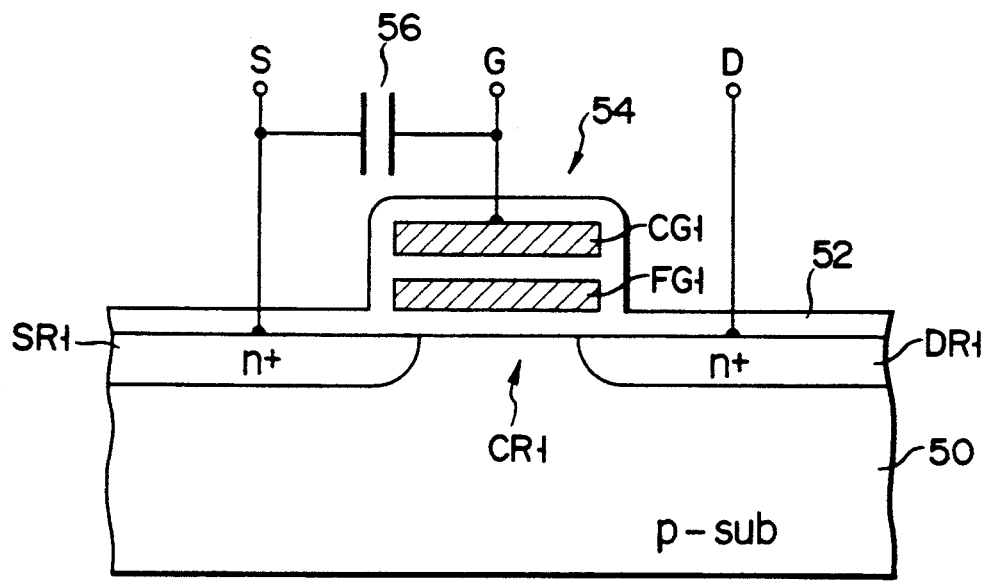
FIG. 7 is a pictorial sectional representation of a fourth embodiment of the nonvolatile semiconductor memory device according to the invention.

FIG. 7 shows a further embodiment of the semiconductor memory device. This memory device is a memory cell of an EPROM. The memory device has n+-type source and drain regions SR1 and DR1 formed in surface portions of a p-type silicon substrate 50. A portion of the substrate 50 between the source and drain regions SR1 and DR1 is used as a channel region CR1. The memory device also has a floating gate FG1 formed over and insulated from the channel region CR, and a control gate CG formed over and insulated from the floating gate FG1. An oxide layer 52 wholly covers the floating gate FG1 and control gate CG1, and also covers the exposed portions of the semiconductor structure. The control gate CG1 is connected to a control gate G, to which a control voltage (e.g., of 15 V) is applied. The control voltage is generated from a high level voltage source (not shown) with an output impedance of 10 kΩ, for instance. The source region SR1 is connected to a source terminal S which is held at ground level potential. The drain region DR is connected to a drain terminal D, to which a voltage of 10 V, for instance, is applied. The floating and control gates FG1 and CG1 and source, drain and channel regions SR1, DR1 and CR1 constitute a floating gate MOS transistor 54.

The memory device further has a capacitor 56 connected between the source and control gates SR1 and CG1. The capacitance of the capacitor 56 is approximately 0.1 pF.

When writing data, the control voltage is applied to the control gate CG1. As a result, the capacitor 56 is charged up to 15 V. The charging of the capacitor 56 is completed in several nsec. The supply of the control voltage is discontinued after the lapse of the charging time of the capacitor 56. Then, the voltage of 15 V is applied from the capacitor 56 to the control gate CG1. The floating gate MOS transistor 54 is thus turned on by the control voltage. At this time, a large current results in the channel region CR1 from the voltage of 10 V applied to the drain region DR1. As a result, hot carriers are generated in the channel. The floating gate FG is charged by the hot carriers. This charging is completed in 100 μsec. to 1 msec. During this time, the floating gate MOS transistor 54 is held conductive by the control voltage, which is continually provided from the capacitor 56.

With this embodiment, the time necessary for the control of the operation of writing data in the memory device is reduced to the charging time of the capacitor 56.

Figure 8:
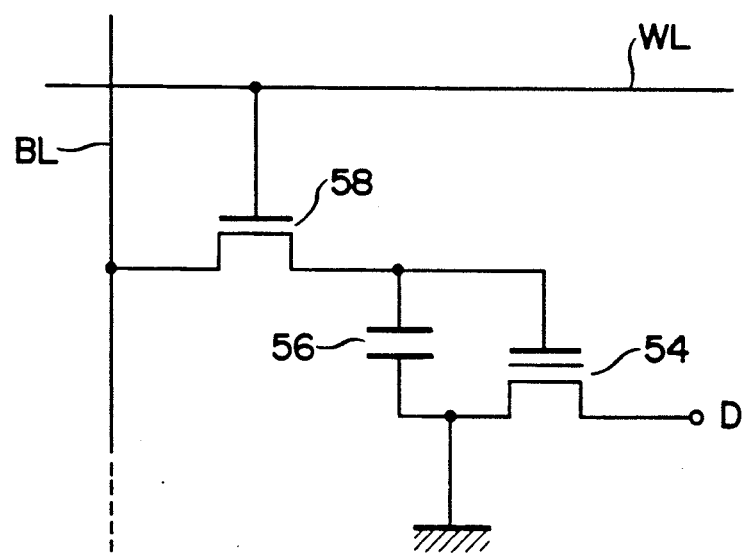
FIG. 8 is a circuit diagram showing a fifth embodiment of the nonvolatile semiconductor memory device according to the invention.

A further embodiment of the invention will now be described with reference to FIG. 8. This embodiment is an EPROM having a number of memory devices, each having the structure shown in FIG. 7. FIG. 8 shows one memory cell of this EPROM. In this memory cell, the control gate of floating gate MOS transistor 54 is connected to bit line BL through a current path constituted by a MOS transistor 58. The MOS transistor 58 is turned on in response to a select signal supplied via word line WL. Capacitor 56 is connected between control gate CG1 and source region SR1 of the floating gate MOS transistor 54. The source region SR1 is grounded. When writing data, a voltage of 10 V, for instance, is applied to the drain region DR.

In this embodiment, the memory cell shown in FIG. 8 is selected via the word line WL and bit line BL. At this time, a voltage of 15 V is applied to the bit line BL, whereby the floating gate FG1 of the floating gate MOS transistor 54 is charged as in the preceding embodiment. With this embodiment, the same effects as obtained in the memory device described before in connection with FIG. 3 can be obtained with an EPROM.

What is claimed is:
1. A nonvolatile semiconductor memory device comprising:
a floating gate MOS transistor having control and floating gates and channel, source and drain regions for storing data corresponding to an amount of charge on said floating gate, said source region having a source region electrode and said drain region having a drain region electrode;
means coupled to said control gate and to one of said source and drain region electrodes for applying a control voltage between said control gate and said one of said source and drain region electrodes to selectively control the charging and discharging of said floating gate, said control voltage applying means terminating the application of the control voltage prior to fully charging and discharging said floating gate; and
capacitive means, connected between said control gate and said one of said source and drain region electrodes, for storing a predetermined voltage substantially equal to said control voltage upon application of said control voltage and applying said predetermined voltage to said floating gate MOS transistor after the termination of said control voltage to essentially fully charge and discharge said floating gate, the capacitance of said capacitances between said control gate and said one of said source and said drain regions and between said floating gate and said one of said source and said drain regions.

2. A nonvolatile semiconductor memory device according to claim 1, wherein said capacitive means is connected between said control gate and said drain region electrodes of the floating gate MOS transistor.

3. A nonvolatile semiconductor memory device according to claim 2 wherein:
the source and drain regions of said floating gate MOS transistor are formed in the surface of a semiconductor substrate; and
the floating gate of said floating gate MOS transistor is formed over and insulated from said drain region, and formed over and insulated from the channel region of said floating gate MOS transistor.

4. A nonvolatile semiconductor memory device according to claim 3, wherein the control gate of said floating gate MOS transistor is formed over and insulated from said floating gate.

5. A nonvolatile semiconductor memory device according to claim 4, wherein said capacitive means includes a conductive layer formed over and insulated from said control gate and contacting said drain region electrode.

6. A nonvolatile semiconductor memory device according to claim 3, wherein the control gate of said floating gate MOS transistor is formed in the surface of said semiconductor substrate and insulated from said floating gate.

7. A nonvolatile semiconductor memory device according to claim 6, wherein said capacitive means includes a conductive layer formed over and insulated from said control gate and said drain region.

8. A nonvolatile semiconductor memory device according to claim 2, wherein said control voltage applying means includes switching means for selectively applying the control voltage to said floating gate MOS transistor.

9. A nonvolatile semiconductor memory device according to claim 8, wherein:
said control voltage applying means further includes a word line for receiving a select signal and first and second bit lines for receiving the control voltage; and
said switching means includes first and second switching means connected between said first bit line and said control gate and between said second bit line and said drain region, respectively, said first and second switching means being turned on responsive to said select signal supplied from said word line and turned off in the absence of said select signal.

10. A nonvolatile semiconductor memory device according to claim 9, wherein:
the source region, drain region and the control gate of said floating gate MOS transistor are formed in the surface of a semiconductor substrate;
the floating gate of the floating gate MOS transistor is formed over and insulated from said drain region, said control gate, and the channel region provided between said source and drain regions; and
said capacitive means includes a conductive layer formed over and insulated from said control gate and said drain region.

11. A nonvolatile semiconductor memory device according to claim 10, wherein:
said first switching means comprises an insulation gate MOS transistor whose current path contacts said control gate; and
said second switching means comprises an insulation gate MOS transistor whose current path contacts said drain region terminal.

12. A nonvolatile semiconductor memory device according to claim 9, wherein:
the source and drain regions of said floating gate MOS transistor are formed in the surface of a semiconductor substrate;
the floating gate of said floating gate MOS transistor is formed over and insulated from the channel region of said substrate provided between said source and drain regions, and formed over and insulated from said drain region;
the control gate of the floating gate MOS transistor is formed over and insulated from said floating gate; and
said capacitive means includes a conductive layer formed over and insulated from said control gate and contacting said drain region electrode.

13. A nonvolatile semiconductor memory device according to claim 1, wherein said capacitive means is connected between said control gate and the source region electrode of the floating gate MOS transistor.

14. A nonvolatile semiconductor memory device according to claim 13, wherein:
the source and drain regions of said floating gate MOS transistor are formed in the surface of a semiconductor substrate;
the floating gate of said floating gate MOS transistor if formed over and insulated from the channel region of said substrate provided between said source and drain regions; and
the control gate of said floating gate MOS transistor is formed over and insulated from said floating gate.

15. A nonvolatile semiconductor memory device according to claim 13, wherein said control voltage applying means includes switching means for selectively applying the control voltage to said floating gate MOS transistor.

16. A nonvolatile semiconductor memory device according to claim 15, wherein:
said control voltage applying means further includes a bit line for receiving the control voltage and a work line and receiving the select signal; and
said switching means is connected between said bit line and said control gate, said switching means being turned on responsive to said select signal supplied from the word line and turned off in the absence of said select signal.

* * * * *